United States Patent [19]

Webb et al.

[11] Patent Number: 4,914,045

[45] Date of Patent: Apr. 3, 1990

[54] METHOD OF FABRICATING PACKAGED TRIAC AND TRIGGER SWITCH

[75] Inventors: Monty F. Webb, Vinh Q. Le, Elmer L. Turner, Jr, all of Irving, Tex.

[73] Assignee: Teccor Electronics, Inc., Irving, Tex.

[21] Appl. No.: 193,193

[22] Filed: May 9, 1988

Related U.S. Application Data

[63] Continuation of Ser. No. 811,161, Dec. 19, 1985, abandoned.

[51] Int. Cl.⁴ .............................................. H01L 21/31
[52] U.S. Cl. ........................................... 437/6; 437/51; 437/209; 148/DIG. 126; 357/76
[58] Field of Search .................. 437/6, 209, 51, 67, 437/224, 205, 209; 148/DIG. 126; 357/38, 39, 13, 89, 52; 307/324

[56] References Cited

U.S. PATENT DOCUMENTS

| | | | |
|---|---|---|---|
| 3,123,750 | 3/1964 | Hutson et al. | 357/39 |
| 3,236,698 | 2/1966 | Shockley | 357/38 |
| 3,281,628 | 10/1966 | Bauer et al. | 357/81 |
| 3,524,114 | 8/1970 | Hutson | 357/39 |
| 3,535,615 | 10/1970 | Howell et al. | 357/39 |
| 3,582,762 | 6/1971 | Mori | 357/75 |
| 3,609,747 | 9/1971 | Ngo | 307/324 |
| 3,835,530 | 9/1974 | Kilby | 437/209 |
| 3,917,962 | 8/1975 | Pascente | 307/647 |
| 3,961,354 | 6/1976 | Kuwagata et al. | 357/39 |
| 3,970,843 | 7/1976 | Dumas | 357/39 |
| 4,063,277 | 12/1977 | Gooen | 357/39 |
| 4,128,801 | 12/1978 | Gansert et al. | 357/75 |
| 4,134,778 | 1/1979 | Sheng et al. | 437/24 |
| 4,156,148 | 5/1979 | Kaufman | 357/19 |
| 4,224,634 | 9/1980 | Suedberg | 357/59 |
| 4,242,598 | 12/1980 | Johnson et al. | 357/81 |
| 4,264,917 | 4/1981 | Ugon | 437/211 |
| 4,298,881 | 11/1981 | Sakurada et al. | 357/39 |
| 4,320,412 | 3/1982 | Hynes et al. | 437/211 |
| 4,639,760 | 1/1987 | Granberg et al. | 357/75 |

FOREIGN PATENT DOCUMENTS 0098914  6/1983  Japan ....................................... 437/6

OTHER PUBLICATIONS

Teccor Electronics, Inc., *General Catalog: Semiconductor Devices*, pp. 8–9, 95–103 (1982).
General Electric Co., SCR Manual, p. 110 (6th Ed. 1979).

Primary Examiner—Brian E. Hearn
Assistant Examiner—T. Thomas
Attorney, Agent, or Firm—Richards, Medlock & Andrews

[57] ABSTRACT

A two-terminal, bidirectional semiconductor trigger switch is provided. The trigger switch is a relatively sensitive multilayer semiconductor breakover device that switches on fully when its breakover voltage is reached. The design of the trigger switch allows its breakover voltage point to be readily adjustable during fabrication of the device.

The semiconductor trigger switch is particularly suited to provide a low voltage trigger for a TRIAC. The trigger switch is connected in series with the gate of the TRIAC and mounted on the gate lead to provide a unitary, three-terminal device incorporating the TRIAC/trigger switch combination.

1 Claim, 1 Drawing Sheet

U.S. Patent    Apr. 3, 1990    4,914,045
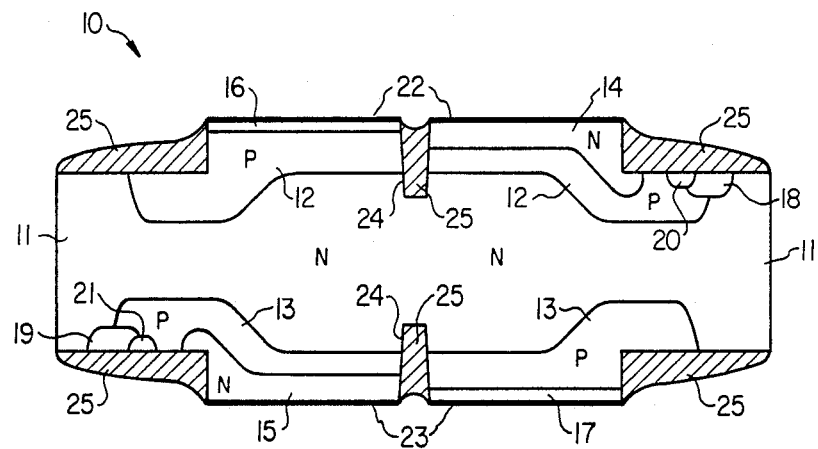
FIG. 1
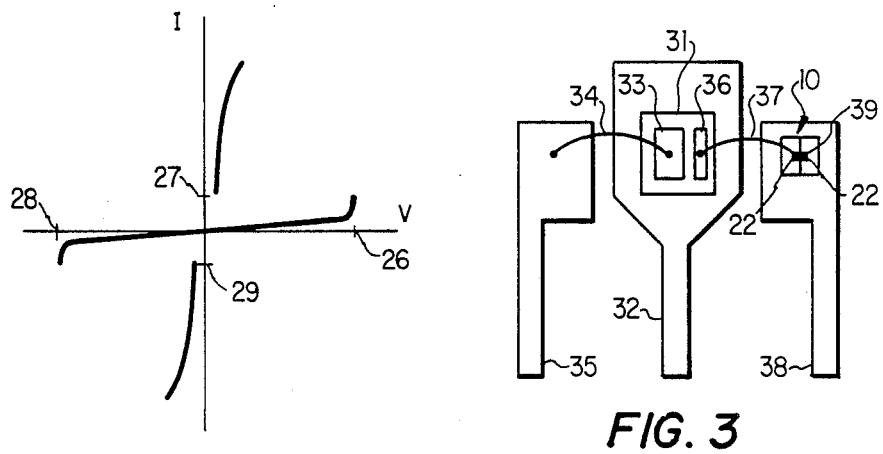
FIG. 2
FIG. 3

METHOD OF FABRICATING PACKAGED TRIAC AND TRIGGER SWITCH

This application is a continuation of application Ser. No. 811,161, filed Dec. 19, 1985, now abandoned.

TECHNICAL FIELD

This invention relates to semiconductor devices, and more particularly, to multi-layer semiconductor switching devices.

BACKGROUND OF THE INVENTION

Semiconductor switching devices have long been utilized in a variety of electronic control applications. Semiconductor devices of the thyristor family, including silicon controlled rectifiers (SCRs) and TRIACS, are characterized by having two states, an on-state and an off-state, making them useful for electric power regulation, switching, and phase control. An SCR is a unidirectional PNPN semiconductor device having an anode, a cathode, and a gate. In the off-state, an SCR is a high-resistance, low-current circuit element at voltages up to its breakover voltage. A momentary positive pulse applied to the gate of an SCR will bias the device so that it switches to the on-state and becomes a low-resistance, high-current element. Once an SCR is in the on-state, it will remain in the on-state until the principal anode-to-cathode current drops below the holding current of the device.

A TRIAC is a three-terminal, bidirectional thyristor which functions to control power in an AC electric circuit. The electrical characteristics of a TRIAC can be compared to that of two SCRs connected in inverse parallel relationship. Thus, a TRIAC functions essentially the same in both directions as an SCR behaves in its forward direction. A TRIAC has a single gate, and it can be triggered to the on-state by a gate pulse of either polarity.

A five-layer, bidirectional Shockley diode is a two-terminal semiconductor device which functions essentially the same as an SCR, but in both directions. As voltage is applied to either terminal, the device acts to block current until the voltage reaches a breakover level, at which point the device turns on and allows current to flow. This type of device is relatively nonsensitive in that the switching current and the holding current required to maintain the device in its on-state are generally 5 to 500 milliamperes. Furthermore, the breakover voltage level of the device is relatively inflexible in that it depends on the resistivity of the semiconductor slice and the concentration gradient of the diffused ions. If the device is fabricated with resistivity chosen for low breakover voltage, the conductivity of the device is impaired at the point immediately after breakover, and the voltage-current curve has a positive slope up to the breakover voltage point, which normally is undesirable. The undesirable slope of the voltage-current curve can be reduced by decreasing the thickness of the semiconductor chip, but processing of thin semiconductor wafers becomes impractical due to handling and breakage problems.

In many electrical applications it is desirable to have a switching device with a bidirectional, low voltage, low current triggering response. Furthermore, it would be desirable to provide a breakover device that is relatively sensitive, that switches on fully when the breakover voltage is reached, and whose voltage breakover point is readily adjustable during fabrication of the device.

SUMMARY OF THE INVENTION

The silicon trigger switch (STS) of the present invention is a semiconductor breakover device that is relatively sensitive and whose breakover voltage is readily adjustable during fabrication. The STS is a two-terminal, bidirectional semiconductor device that switches on fully when its breakover voltage point is reached.

The STS of the present invention is fabricated from a thin slice of semiconductor material. Using conventional masking and diffusion doping techniques, layers of alternating conductivity type are diffused on both sides of the semiconductor slice. A mesa/planar chip structure may be used so that the blocking junctions produced by diffusion are more accessible to subsequent alignments and diffusions to adjust the breakover voltage point during fabrication of the device.

The STS is fabricated using N-type or P-type silicon slices chosen with appropriate resistivity and thickness so as to minimize the positive slope of the voltage-current response after the breakover point. Diffusion doping techniques are then employed to produce a bilateral PNPN device having a response similar to that of two silicon controlled rectifiers connected in inverse parallel relationship. However, the resulting device is relatively nonsensitive because the emitters are shorted to their bases, which is common in thyristors. To achieve a sensitive device, an isolator grid is etched into both sides of the device to isolate the PNPN structure from the adjacent inverse PNPN structure. The isolator grid works in conjunction with regions of augmented doping at the breakover junction on each side of the device to lower the breakover voltage level and insure that breakover occurs at the proper junction. An external connector is provided across the isolator grid on each side of the chip so that the STS has only two terminals, one on each side of the chip.

In many electrical applications it is desirable to have a power control circuit having a low voltage, low current triggering response with a relatively high holding current requirement. The high holding current can be provided by a TRIAC. To achieve low voltage triggering capability for TRIACs, it has been necessary to employ a separate triggering device such as the General Electric type 2N4991 silicon bilateral switch, or a relatively complicated triggering circuit comprising a plurality of transistors, resistors, and diodes in a bridge network.

The STS of the present invention is particularly suited to provide a low voltage trigger for a TRIAC. Because of its design wherein the two terminals are on opposite sides of the chip, the STS can be connected by attaching a lead from the gate of the TRIAC to one side of the STS and mounting the other side of the STS in direct metallic contact with the electrode that had been attached directly to the gate of the TRIAC. The resulting device is a power control TRIAC having a sensitive, low voltage trigger switch connected to its gate. This combination results in a single package semiconductor device which is relatively easy to fabricate, relatively inexpensive, and which replaces a plurality of semiconductor devices used in previous electrical circuit designs that are relatively expensive and difficult to fabricate. In addition to the cost and time saving benefits realized by replacing a plurality of elements with a single device, the easily adjustable characteristics of the STS enable production of a combination TRIAC/STS device having breakover voltage characteristics that are adjustable to meet a variety of circuit requirements.

BRIEF DESCRIPTION OF THE DRAWINGS

For a more complete understanding of the present invention and the advantages thereof, reference is now made to the following Description of the Preferred Embodiments taken in conjunction with the accompanying Drawings, in which:

FIG. 1 is a cross-sectional diagram of the silicon trigger switch semiconductor wafer of the present invention;

FIG. 2 is a voltage-current characteristic curve of the silicon trigger switch of the present invention; and FIG. 3 is an enlarged top plan view of a device comprising a TRIAC in combination with the silicon trigger switch of the present invention.

DESCRIPTION OF THE PREFERRED EMBODIMENTS

Referring to FIG. 1, an enlarged cross-sectional view of a silicon trigger switch (STS) 10 of the present invention is illustrated. STS 10 is a semiconductor device formed from a wafer of semiconductor material wherein layers of opposite conductivity-type material are formed in both sides of the wafer using conventional masking, diffusion, and etching techniques.

Depending on the level of diffusion doping, the electrical properties of N-type and P-type semiconductor materials vary. Relative terminology has evolved to distinguish between various doping levels of the same type of semiconductor material in a multilayer device. Normally, a semiconductor material is lightly doped and is termed either N-type or P-type. When a region of heavier doped material is included within the same semiconductor device, it is termed N+ or P+. On the other hand, if there is a region of very lightly doped semiconductor material, it will be termed N− or P−. The "+" or "" symbol denotes relative doping levels, not electrical charge.

In the mesa/planar embodiment of the STS 10 illustrated in FIG. 1, the main body 11 of STS 10 comprises N-type semiconductor material. P-type layers 12 and 13 are diffused into both sides of body 11. N-type layers 14 and 15 are diffused into portions of P-type layers 12 and 13, respectively. These diffusion steps yield a bilateral PNPN semiconductor device having layers 14, 12, 11, 13, and 15 of alternating opposite conductivity-type material.

The breakover voltage at the junctions between N-type layer 11 and P-type layers 12 and 13 of the basic device is relatively high, approximately 400 volts, depending on the resistivity of the semiconductor slice. The breakover voltage can be lowered to approximately 20 volts, for example, by diffusing N+ regions 18 and 19 on the PN junctions between layers 11 and 12 and layers 11 and 13, respectively. If desired, P+ diffusion regions 20 and 21 can be added to lower the breakover voltage between the P+ and N+ regions to about 8–12 volts. During this fabrication step, P+ layers 16 and 17 may be diffused to prepare the device for ohmic contact.

The N+ diffusion regions 18 and 19 function to lower the breakover voltage level and allow breakover to occur at the proper PN junction. If breakover occurs at the PN junction on the wrong side of the device, the STS will not switch to the on-state, and high voltage may damage the device.

To achieve a sensitive switching device, isolator grids 24 are etched into each side of the wafer to isolate the PNPN structure from the adjacent inverse PNPN structure. The isolator grids 24 work in conjunction with the N+ regions 18 and 19 to ensure that breakover occurs on the proper side of the device and at the proper breakover voltage level.

After the diffusion layers and the isolator grids have been formed as described above, the device is completed by adding metallization layers 22 and 23 on both sides of the wafer and adding glass passivation 25 to the exposed junctions of the external grid and the isolator grids 24. Since the isolator grids 24 are etched completely across the top and bottom surfaces of the device, an external connector must span isolator grid 24 and connect both halves of metallization layer 22 to form a first main terminal, and a similar connector must connect both halves of metallization layer 23 to form a second main terminal.

The voltage-current electrical characteristic curve of STS 10 is illustrated in FIG. 2. STS 10 exhibits very high resistance as voltage increases across the device. When the voltage reaches the breakover level 26, the device switches to its on-state and becomes a low-voltage, high-current device. Holding current 27 is the minimum current required to maintain the device in its on-state. FIG. 2 shows the bidirectional behavior of STS 10 by illustrating the symmetrical response as STS 10 is biased in the opposite direction. As voltage of opposite polarity increases in magnitude, the device remains in its off-state until breakover point 28 is reached and the device becomes conductive in the opposite direction. Holding current 29 is the minimum current required to maintain the device in its conductive on-state in the opposite direction.

FIG. 3 illustrates a method of using the silicon trigger switch 10 of the present invention in combination with a TRIAC. TRIAC 31 is mounted with its main terminal two (MT2), located on the bottom of the chip, connected directly to MT2 connector 32. Main terminal one (MT1) 33 of TRIAC 31 is connected by lead 34 directly to MT1 connector 35. The gate 36 of TRIAC 31 is normally connected by lead 37 directly to gate connector 38. However, STS 10 of the present invention may be used in combination as a trigger switch for TRIAC 31. Because STS 10 has its terminals on opposite sides of the chip, STS 10 can be mounted with the bottom terminal connected directly to gate connector 38. Contact 39 spans isolator grid 24 of STS 10 and connects both portions of the top terminal 22 of STS 10 to gate 36 of TRIAC 31 via lead 37. Leads 34 and 37 may comprise copper bridges, for example.

The TRIAC/STS device illustrated in FIG. 3 provides an electrical device having the characteristics of a low switching current, a high holding current, and a specific low voltage breakover point of either polarity. In certain previous uses of a TRIAC, complicated electronic circuitry comprising a plurality of elements was necessary to provide a low voltage trigger for the TRIAC. In the device illustrated in FIG. 3, STS 10 provides a low voltage trigger for TRIAC 31, and the entire circuitry is mounted in a single package having three terminals 32, 35, and 38, which correspond to the three terminals of a TRIAC as used alone in previous applications.

From the foregoing description it can be seen that the present invention provides advantages in certain electrical circuit applications due to the simplicity of its structure and the cost savings associated with the reduction of elements, assembly steps, and connectors. Whereas the present invention has been described with respect to specific embodiments thereof, it is understood that various changes and modifications will be suggested to those skilled in the art, and it is intended that this disclosure encompass such changes and modifications as fall within the scope of the appended claims.

We claim:

1. A method for fabricating a TRIAC and a low voltage silicon trigger switch as a single semiconductor packaged device having three terminals, comprising the step of:

mounting a first main terminal of a TRIAC integrated circuit chip directly to a first metallic terminal of the semiconductor device so that electrical signals can be coupled between said first metallic terminal and said TRIAC chip;

connecting a second main terminal of said TRIAC chip to a second metallic terminal of the semiconductor device;

forming an isolation groove in a silicon trigger switch integrated circuit chip in opposing conductive sides thereof to isolate a first PNPN structure from an adjacent inverse PNPN structure, filling said grooves with an isolation material, and forming a pair of metallization layers on each side of the chip isolated by a respective said isolation groove;

mounting one said conductive side of the silicon trigger switch integrated circuit chip directly to a metallic gate terminal of the semiconductor device so that both pairs of metallization layers of said mounted side are short circuited and one PNPN structure is shorted to the inverse PNPN structure;

short circuiting the pair of metallization layers of the other conductive side of said trigger switch chip with a conductive bridge; and connecting a gate of the TRIAC chip to the conductive bridge of said silicon trigger switch chip, whereby a packaged device having three package terminals corresponding to the three terminals of the TRIAC provide a TRIAC triggered by low voltage silicon trigger switch.

* * * * *